United States Patent [19]

Voorman

[11] 4,015,207
[45] Mar. 29, 1977

[54] ANTI-RECIPROCAL NETWORK

[75] Inventor: Johannes Otto Voorman, Eindhoven, Netherlands

[73] Assignee: U.S. Philips Corporation, New York, N.Y.

[22] Filed: Nov. 4, 1975

[21] Appl. No.: 628,591

[30] Foreign Application Priority Data

Nov. 14, 1974 Netherlands ...................... 7414850
Dec. 18, 1974 Netherlands ...................... 7416482

[52] U.S. Cl. .............................. 333/80 T; 307/295
[51] Int. Cl.² .................... H03H 7/44; H03H 11/00
[58] Field of Search ................... 333/80 T; 307/295

[56] References Cited

UNITED STATES PATENTS

| 3,500,262 | 3/1970 | Daniels | 333/80 T |
|-----------|--------|---------|----------|
| 3,599,008 | 8/1971 | Gorski-Popiel | 333/80 T X |
| 3,860,893 | 1/1975 | Ropars et al. | 333/80 T X |

Primary Examiner—Paul L. Gensler
Attorney, Agent, or Firm—Frank R. Trifari; Daniel R. McGlynn

[57] ABSTRACT

An anti-reciprocal network including at least a first and a second port each with two terminals, the ports being included in a closed loop which has at least three impedance elements. The network also includes two amplifiers which are coupled to the two ports, wherein each of the amplifiers includes a transistor.

9 Claims, 5 Drawing Figures

ANTI-RECIPROCAL NETWORK

The invention relates to an anti-reciprocal network, comprising at least a first and a second port each having two terminals, which ports are included in a closed loop, which moreover includes at least three impedance elements, while the network also comprises two amplifiers which are coupled to the two ports.

In this respect it is to be noted that an anti-reciprocal network with two ports is to be understood to mean a network which at the one port has an impedance of $+k/Z(k > 0)$ if the other port is terminated by an impedance Z. Networks of this type are gyrators. A gyrator, as is known, converts the capacitance connected to the one port into a synthetic inductance, which together with the capacitors connected to the other port constitutes a resonant circuit. The gyrator then has the known property that the magnitude of the synthesized inductance can be varied in principle by varying the gyrator constant k, which means that by changing the setting of resistors the gyrator resonant circuit can be detuned in a particularly simple manner.

A general criterion for the usefulness of such a device is the magnitude of the quality factor Q of the resonant circuit realized with the aid of the gyrator. The effective use of bipolar monolithic constructions has enabled gyrator resonant circuits to be realized whose frequency is tunable over several octaves and which moreover has a comparatively high Q-factor.

An anti-reciprocal network of the abovementioned type is known from "Proceedings I.E.E.", Vol. 115, No. 11, November 1969, page 1842, FIG. 9d. In this known anti-reciprocal network, which is of the gyrator type, the amplifiers are constituted by operational amplifiers. The closed loop in this order comprises the first terminal of a first port, a first impedance element, a second impedance element, a third impedance element, a first and a second terminal of a second port, a fourth impedance element and the second terminal of the first port. Between the first terminal of the first port and the first terminal of the second port an amplifier is included. Between the second terminal of the second port and the connection point of the first and the second impedance element a second amplifier is included.

This known gyrator comprises two operational amplifiers. As is known, said operational amplifiers frequently comprise several cascaded transistor amplifier stages. Since the signal to be processed must pass through all these stages, said signal will be subject to a delay which depends on the number of amplifier stages used. As a result, the overall cut-off frequency of the amplifier, which is related to said delay, will also depend on the number of amplifier stages used. The more amplifier stages are used, the lower said overall cut-off frequency will be. As is known, the cut-off frequency per transistor and thus the overall cut-off frequency of the amplifier, can be increased by increasing the quiescent current of the transistors. However, this implies that the dissipation of the amplifier will increase substantially, which is unfavorable, in particular when said amplifier is integrated on a chip. Furthermore, the transistor amplifiers are included in a loop. In order to prevent high-frequency oscillations, the amplifiers should exhibit a roll-off of less than 6 dB/octave. This implies that in a specific frequency range only one time constant may be effective. This means that the time constants of the various amplifier stages should have a sufficient mutual difference. The overall cut-off frequency will be determined by the transistor stage with the lowest cut-off frequency.

Summarizing, it may be stated that due to the fact that operational amplifiers are used as amplifiers and due to the fact that said operational amplifiers are included in a loop, the known gyrator is less suitable for specific applications, where a comparatively high quality factor is required at a high frequency and a prescribed maximum permissible dissipation. Moreover, the complexity of the operational amplifiers has the disadvantage that if the gyrator is integrated on a chip a substantial area of this chip is occupied.

It is an object of the invention to provide an anti-reciprocal network, which mitigates the abovementioned drawbacks and the invention is characterized in that each of the amplifiers is constituted by a transistor, the closed loop being formed, in this order, by the first terminal of the first port, a first impedance element 15, a second impedance element 12, the first and the second terminal of the second port, a third impedance element 13, and the second terminal of the first port, while between the second terminal of the second port and the first terminal of the first port the base-collector path of a first transistor 10 is included, and between the first terminal of the second port and the second terminal of the first port the collector-emitter path of a second transistor 11 is included, whose base is connected to the terminal of the first impedance 15 which is remote from the first terminal.

In a preferred embodiment the base of the second transistor is connected to a first terminal of a third port, and the terminal of the second impedance element which is remote from the collector of the second transistor is connected to a second terminal of a third port. The anti-reciprocal network is then a circulator.

In a second preferred embodiment the base of the second transistor is connected to the terminal of the second impedance element which is remote from the collector of the second transistor via a fourth impedance element. The anti-reciprocal network then forms a gyrator.

The invention is based on the recognition that with the aid of four resistors and two amplifiers 12 different gyrators can be realized, while only one of these 12 possible gyrators can be formed by only two transistors without additional power-supply provisions such as current sources and many additional resistors.

The invention will be described with reference to the drawing.

Figure 1:
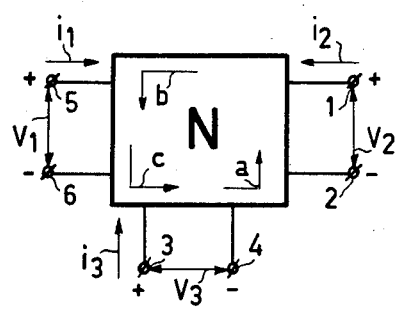
FIG. 1 shows a three-port anti-reciprocal network for illustration.

FIG. 1 shows an anti-reciprocal network comprising the port 1, 2, 3, 4 and 5, 6. The antireciprocal network is of the circulator type. A circulator has the property that signal transfer between every two ports is possible in one direction only. When an input signal is applied to the port 3, 4, an output signal will appear at the port 1, 2 only. No signal is then measured at the port 5, 6. This is indicated by the arrow a. When an input signal is applied to the port 1, 2, an output signal will appear at the port 5, 6 only. In this case no signal is measured at the port 3, 4. This is indicated by the arrow b. When an input signal is applied to the port 5, 6 an output signal will appear at the port 3, 4 only. No signal is then measured at the port 1, 2. This is indicated by the arrow C. The circulator may, for example, be used in telephony circuits as a co-called hybrid network. If one of the ports 1, 2, 3, 4 or 5, 6 is terminated by a resistor, the anti-reciprocal network is a gyrator, which as stated previously, converts the capacitance connected to the one port into a synthetic inductance, which together with the capacitance connected to the other port constitutes a resonant circuit.

Figure 2:
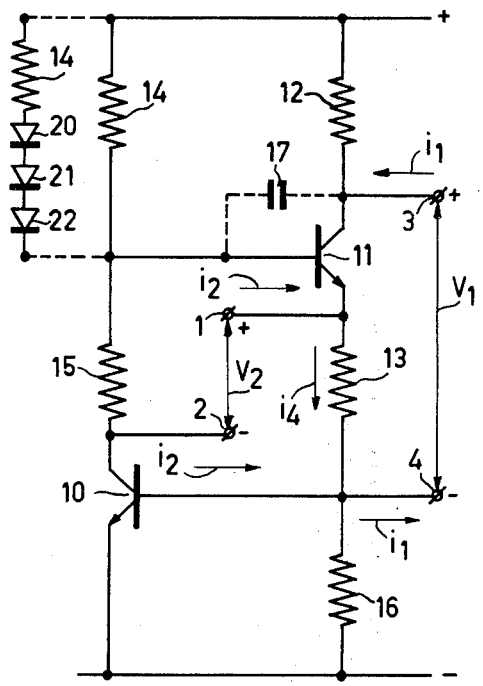
FIG. 2 shows an anti-reciprocal network of the gyrator type according to the invention.

The gyrator of FIG. 2 comprises a first transistor 10 and a second transistor 11. The closed loop in this order comprises a first terminal 2 of the first port 1, 2, a resistor 15, a resistor 14, a resistor 12, the second port 3, 4 the resistor 13, and the second terminal 1 of the first port 1, 2. The connection point of the resistors 12 and 14 is connected to a point of constant potential. The base of the transistor 11 is connected to the connection point of the resistors 14 and 15. The collector of the transistor 11 is connected to the terminal 3 of the second port 3, 4. The emitter of the transistor 11 is connected both to the terminal 1 of the first port 1, 2 and to the terminal 4 of the second port via the resistor 13. The terminal 4 of the second port is connected both to a point of constant potential via a resistor 16 and to the base of the transistor 10. The emitter of transistor 10 is connected to a point of constant potential and the collector of said transistor is connected to the terminal 2 of the first port 1, 2. The operation of the gyrator of FIG. 2 is as follows. In this respect it is to be noted that the a.c. behavior of the gyrator is examined more closely, which means that the points of constant potential + and − may be regarded as being interconnected. The voltage across the resistor 12 will then equal $V_1$ volts, assuming that the base-emitter signal voltage of the transistor 10 is negligible. Consequently, a current will flow through the resistor 12 which equals $V_1/R(12)$ amps, where $R(12)$ equals the resistance value of the resistor 12. This current flows from the collector of the transistor 11 to the point + of constant potential. A current $i_1$ flows from terminal 3 to the collector of transistor 11. The current $i_1$, which flows to terminal 4, also flows through the resistor 13 in the indicated direction, if the base current of the transistor 10 is neglected. The current through the transistor 11 consequently equals $i_1-i_2=i_1-V_1/R(12)$. This yields the relation:

$$i_2 = \frac{V_1}{R(12)} \quad (1)$$

The current through the resistor 15 equals $V_2/R(15)$, where $R(15)$ is the resistance value of the resistor 15. If the base current of the transistor 11 is neglected, said current will also flow through the resistor 14, so that the voltage across this resistor will equal:

$$V_2 \cdot \frac{R(14)}{R(15)} \text{ volts}$$

The same voltage will appear across the resistor 13. Due to this voltage, a current will flow through the resistor 13, which current equals said voltage divided by $R(13)$, where $R(13)$ is the resistance value of the resistor 13. This current is equal and opposite to the current $i_1$, so that the following relation is valid:

$$i_1 = -\frac{V_2}{R(13)} \cdot \frac{R(14)}{R(15)} \quad (2)$$

A simple calculation with the aid of the relations 1 and 2 reveals that if one of the ports is terminated by an impedance Z, an impedance is measured at the other gate which equals $$Z_v = \frac{R(12)R(13)R(15)}{R(14)} \cdot \frac{1}{Z} = \frac{k}{Z} \quad (3)$$

From relation 3 it appears that if a capacitance is connected to the port 1, 2, an inductance will be measured at the port 3, 4. When also a capacitance is connected to port 3, 4 a gyrator resonant circuit is obtained. The following relations apply to this resonant circuit, if $R(12) = R(15) = R$ and $R(13) = R(14) = 2R$.

$$\omega_o = \frac{1}{RC} \cdot \left(1 - \frac{1}{SR}\right) \quad (4)$$

$$\frac{1}{Q} = \frac{4}{\beta} + \frac{3}{SR} + \frac{2}{SR(16)} \quad (5)$$

In these relations $\omega_o$ is the resonant frequency, Q the quality factor, C the capacitance value of the two capacitances connected to the two ports, S the slope of the transistors 10 and 11, $\beta$ the base-collector current gain factor, and $R(16)$ the resistance value of the resistor 16. The quality factor Q can be rendered substantially independent of the frequency by including a capacitance 17 between the base and the collector of the transistor 11. From relation 4 it appears that the resonant frequency is independent of the $\beta$ of the transistor. Furthermore, the resonant frequency can also be made independent of the slope S of the transistor by including some diodes in series with the resistor 14. In FIG. 2 the diodes 20, 21 and 22 are shown. Due to the last-mentioned step the resonant frequency has become independent of all transistor parameters. The gyrator of FIG. 2 is extremely simple and is therefore highly suitable for integration. Furthermore, the dissipation will be very low at a comparatively high Q for a specific frequency.

Figure 3:
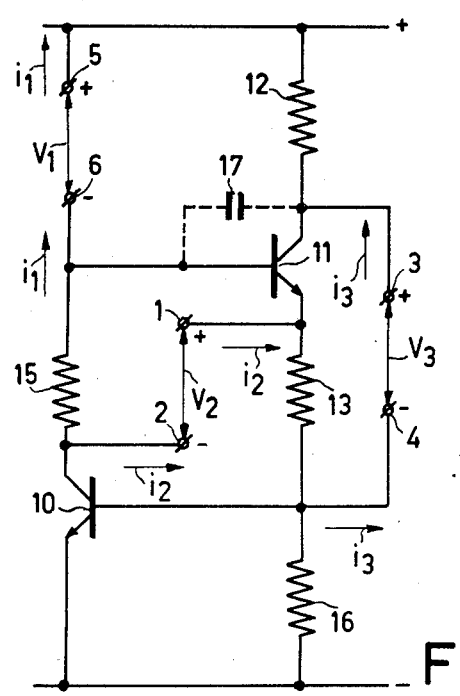
FIG. 3 shows an anti-reciprocal network of the circulator type according to the invention.

When the resistor 14 in FIG. 2 is omitted, and a port 5, 6 is included between the base of the transistor 11 and the point of constant potential, a circulator is obtained, see FIG. 3. A similar calculation as for the gyrator of FIG. 2 yields the following relations:

$$i_1 = \frac{V_2}{R(15)}$$

$$i_2 = +\frac{V_3}{R(12)}$$

$$i_3 = -\frac{V_1}{R(13)}$$

In this calculation the base currents of the transistors 10 and 11, as well as the base emitter voltages of these transistors have been neglected for simplicity.

Figure 4:
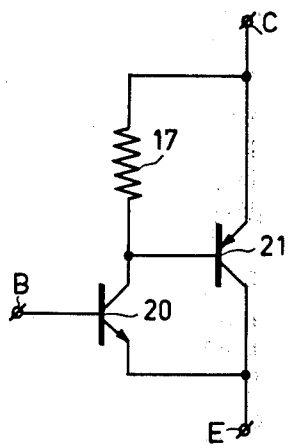
FIG. 4 shows an equivalent transistor for use in the networks of FIGS. 2 and 3.

Instead of the single transistors 10 and 11 it is also possible to use equivalent transistors. FIG. 4 shows an example of such an equivalent transistor. The equivalent transistor comprises the transistors 20 and 21. The emitter-collector path of the PNP-transistor 21 is included between the collector terminal C and the emitter terminal E of the equivalent transistor. The collector-emitter path of the transistor 20 is included between the base and the collector of the transistor 21. Between the base and the emitter of the transistor 21 the resistor 17 is included. The base B of the transistor 20 also constitutes the base of the equivalent transistor.

Furthermore, instead of resistors it may be necessary to use more complicated impedance elements, consisting of resistors and capacitors. This may for example be necessary to compensate for phaseshifts in the transistors.

Figure 5:
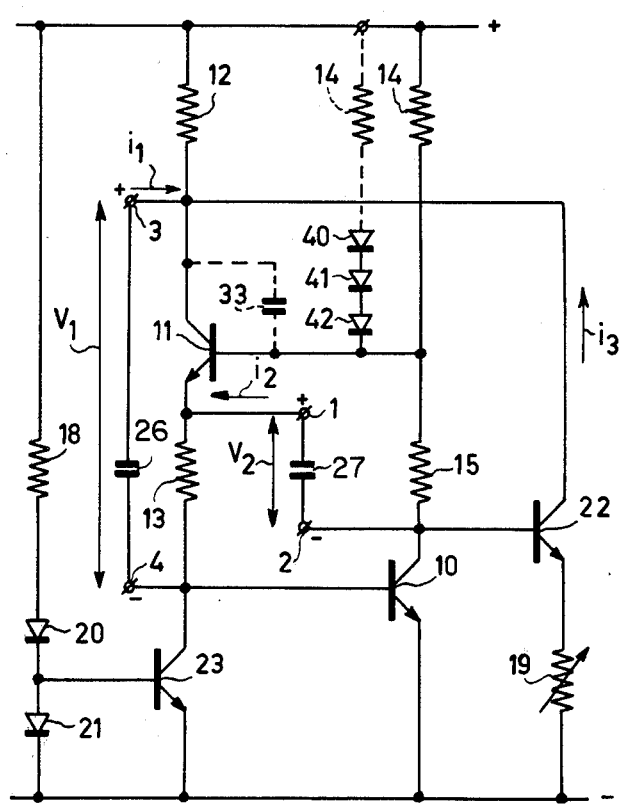
FIG. 5 shows a second embodiment of an antireciprocal network of the gyrator type according to the invention.

The gyrator of FIG. 5 comprises a first transistor 10 and a second transistor 11. The closed loop in this order comprises the first terminal 2 of the first port 1, 2, a resistor 15, a resistor 14, a resistor 12, the second gate 3, 4, the resistor 13, and the second terminal 1 of the first port 1, 2. The connection point of the resistors 12 and 14 is connected to a point of constant potential. The base of the transistor 11 is connected to the connection point of the resistors 14 and 15. The collector of transistor 11 is connected to the connection point 3 of the second gate 3, 4. The emitter of the transistor 11 is connected both to the second terminal 1 of the first port 1, 2 and via the resistor 13 to the terminal 4 of the second port. The terminal 4 of the second port is connected both to the base of the transistor 10 and via the collector-emitter path of the transistor 23 to a point of constant potential. The emitter of the transistor 10 is connected to a point of constant potential and the collector of transistor 10 is connected to the first terminal 2 of the first port 1, 2. The base of transistor 23 is connected both to a point of constant potential via the diode 21 and to a different point of constant potential via the series connection of the diode 20 and the resistor 18. Between the first terminal 2 of the first port and the first terminal 3 of the second port the base-collector path of the transistor 22 is included. The emitter of the transistor 22 is connected to a point of constant potential via the resistor 19. The first port 1, 2 is terminated by the capacitance 27 and the second port 3, 4 is terminated by the capacitance 26. The operation of the gyrator of FIG. 5 is as follows. In this respect it is to be noted that the a.c. behavior of the gyrator will be examined more closely, which means that the points of constant potential + and − may be regarded as being interconnected. The voltage across the resistor 12 will then equal $V_1$ volts, assuming that the base-emitter signal voltage of the transistor 10 is negligible. Consequently, a current which equals $V_1/R(12)$ amperes will flow through the resistor 12, where R(12) is the resistance value of the resistor 12. This current flows from the collector of the transistor 11 to the point + of constant potential. From terminal 3 a current $i_1$ flows to the collector of the transistor 11. The current $i_1$ which flows to the terminal 4, also flows through the resistor 13 in the indicated direction when the base current of the transistor 10 is neglected. The current through the transistor 11 consequently equals $i_1 - i_2 = i_1 - V_1/R(12)$. This yields the relation:

$$i_2 = \frac{V_1}{R(12)} \qquad (6)$$

The current through the resistor 15 equals $V_2/R(15)$, where R(15) is the resistance value of the resistor 15. If the base current of the transistor 11 is neglected, said current will also flow through the resistor 14, so that the voltage across this resistor then equals:

$$V_2 \cdot \frac{R(14)}{R(15)} \text{ volts.}$$

The same voltage will appear across the resistor 13. Due to this voltage a current will flow through the resistor 13, which equals this voltage divided by R(13), where R(13) is the resistance value of the resistor 13. This current is equal and opposite to the current $i_1$, so that the following relations is valid:

$$i_1 = -\frac{V_2}{R(13)} \cdot \frac{R(14)}{R(15)} \qquad (7)$$

A simple calculation with the aid of the relations (6) and (7) reveals that if one of the ports is terminated by an impedance Z, an impedance is measured at the other port which equals $$Z_p = \frac{R(12)R(13)R(15)}{R(14)} \cdot \frac{1}{Z} = \frac{k}{Z} \qquad (8)$$

From relation (8) it appears that if a capacitance 27 is connected to the port 1, 2, an inductance is measured at the port 3, 4. When in addition a capacitance 26 is connected to port 3, 4 a gyrator resonant circuit is obtained. For this resonant circuit the following relations are valid, if R(12) = R(15) = R and R(13) = R(14) = 2R.

$$\omega_o = \frac{1}{RC} \cdot \left(1 - \frac{1}{SR}\right)$$

$$\frac{1}{Q} = \frac{4}{\beta} + \frac{3}{SR} + \frac{2}{SR(16)} \qquad (9)$$

In these relations $\omega_o$ is the resonant frequency, Q the quality factor, C the capacitance value of the capacitances connected to two ports, S the slope of the transistors 10 and 11, $\beta$ the base-collector current-gain factor, and R(16) the impedance value of the current source 23.

From relation 10 it appears that the magnitude of the quality factor Q is limited by the fact that the transistors which are used are non-ideal. In relation 10 the slope S and the base-collector current-gain factor $\beta$ occur, which quantities are of infinite magnitude. A simple calculation reveals, that the current $i_3$ through the emitter-collector path of the transistor 22 equals $$i_3 = \frac{V_2\{1 + R(14)/R(15)\}}{R(19)} \cdot \frac{V_1}{R(12)} \cdot \frac{j}{\omega_C} \qquad (11)$$

where C is the capacitance value of the capacitances 16 and 17, R(19) is the resistance value of the resistor 19 and $\omega$ the angular frequency. Furthermore, a simple calculation reveals that by the application of the current $i_3$ to the collector of the transistor 11 an improvement of the quality factor is achieved. After including the transistor 22, it is found that the quality factor complies with the following relations:

$$\frac{1}{Q'} = \frac{1}{Q} + tg\,\delta \qquad (12)$$

$$tg\,\delta = \frac{-\{1 + R(14)/R(15)\}}{R(19)} \cdot \frac{1}{\omega_c} \qquad (13)$$

where Q' is the obtaining quality factor and Q the quality factor in accordance with the relation 10.

Instead of the transistor 23 it is also possible to use a normal resistor, which is then connected between the base of the transistor 10 and the point of constant negative potential.

By selecting the resistance value of the resistor 18 to equal the sum of the resistance values of the resistors 13 and 14, it is achieved that in the case of differently selected supply voltages the current in the two branches of the gyrator remains automatically the same. In this respect it is to be noted that the first branch is formed by the series connection of the resistor 12, the collector-emitter path of the transistor 11, the resistor 13, and the collector-emitter path of the transistor 23, and that the second branch is formed by the series connection of the resistor 14, the resistor 15, and the collector-emitter path of the transistor 10. Furthermore, the quality factor Q can be rendered substantially independent of the frequency by including a capacitance 33 between the base and the collector of the transistor 11. From relation (9) it appears that the resonant frequency is independent of the β of the transistor. Furthermore, the resonant frequency can also be made independent of the slope S of the transistor by including some diodes in series with the resistor 14. In FIG. 5 the diodes 40, 41 and 42 are shown. Due to this last-mentioned step the resonant frequency has become independent of all transistor parameters. The gyrator of FIG. 5 is extremely simple and is therefore highly suitable for integration. Furthermore, the dissipation will be very low at a relatively high Q for a specific frequency.

When the resistor 14 in FIG. 5 is omitted and a port is included between the base of the transistor 11 and the point of constant potential, a circulator is obtained.

Instead of the single transistors 10 and 11 it is also possible to use equivalent transistors of the type of FIG. 4.

Furthermore, instead of resistors, it may be necessary to use more complicated impedance elements consisting of resistors and capacitors. This may for example be necessary to compensate for phase shifts caused by the transistors.

What is claimed is:
1. An anti-reciprocal network, comprising:
  a first and a second port, each having two terminals, included in a closed loop being formed, in order, by the first terminal of the first port, a first impedance element, a second impedance element, the first and the second terminal of the second port, a third impedance element, and the second terminal of the first port;
  a first transistor having a base-collector path included between the second terminal of the second port and the first terminal of the first port, the emitter of said first transistor being connected to its base through a resistor, the connection point of said emitter and said resistor being connected to a point of constant potential; and
  a second transistor having a collector-emitter path included between said first terminal of said second port and said second terminal of said first port, the base of said second transistor being connected to the terminal of the first impedance element which is remote from said first terminal of said first port.

2. An anti-reciprocal network as claimed in claim 1, wherein the base of the second transistor is connected to a first terminal of a third port, and the terminal of the second impedance element which is remote from the collector of the second transistor is connected to a second terminal of a third port.

3. The anti-reciprocal network as claimed in claim 1, wherein said impedance elements are constituted by resistors.

4. The anti-reciprocal network as claimed in claim 1, wherein the first and the second transistor are constituted by an equivalent transistor, which comprises a third transistor and a fourth transistor, the emitter-collector path of the first transistor being included between a collector terminal and the emitter terminal of the equivalent transistor, the collector-emitter path of the second transistor being connected parallel to the base-collector path of the first transistor, a resistor being included between the base and the emitter of the first transistor, and the base of the second transistor being connected to the base terminal of the equivalent transistor.

5. The anti-reciprocal network as claimed in claim 1, wherein a capacitance is included between the base and the collector of the second transistor.

6. The anti-reciprocal network as claimed in claim 1, wherein the base of the second transistor is connected to the terminal of the second impedance element which is remote from the collector of the second transistor via a fourth impedance element.

7. The anti-reciprocal network as claimed in claim 6, wherein the fourth inpedance element is constituted by a resistor in series with a number of semiconductor diodes.

8. The anti-reciprocal network as claimed in claim 1, wherein between the first terminal of the first port and the first terminal of the second port the base-collector path of a third transistor is included, the emitter of the last-mentioned transistor being connected to a point of constant potential via an impedance.

9. The anti-reciprocal network as claimed in claim 8, characterized in that the base of said first transistor is connected to a point of constant potential via the collector-emitter path of a transistor, the base-emitter path of said transistor being shunted by a diode and the base of said transistor being also connected to a different point of constant potential via the series connection of a diode and a resistor.

* * * * *

UNITED STATES PATENT AND TRADEMARK OFFICE
CERTIFICATE OF CORRECTION

PATENT NO. : 4,015,207
DATED : March 29, 1977
INVENTOR(S) : JOHANNES OTTO VOORMAN It is certified that error appears in the above−identified patent and that said Letters Patent are hereby corrected as shown below:

Column 3, line 6, "C" should be --c--

Signed and Sealed this

Twenty-first Day of June 1977

[SEAL]

Attest:

RUTH C. MASON
*Attesting Officer*

C. MARSHALL DANN
*Commissioner of Patents and Trademarks*